United States Patent [19]

Naito et al.

[11] Patent Number: 4,612,511

[45] Date of Patent: Sep. 16, 1986

[54] FM DEMODULATOR INCLUDING PLL AND IMPROVED CIRCUITRY FOR ELIMINATING DISTORTION IN THE OUTPUT THEREOF

[75] Inventors: Michinori Naito; Shigeru Miyamoto, both of Tokyo, Japan

[73] Assignee: Trio Kabushiki Kaisha, Tokyo, Japan

[21] Appl. No.: 543,027

[22] Filed: Oct. 18, 1983

[30] Foreign Application Priority Data

Oct. 26, 1982 [JP] Japan ............................ 57-161139[U]

[51] Int. Cl.⁴ ............................................... H03D 3/00
[52] U.S. Cl. .................................. 329/124; 331/36 C; 331/177 V
[58] Field of Search ......................... 329/50, 122, 124; 331/36 C, 177 U; 332/30 U

[56] References Cited

U.S. PATENT DOCUMENTS 4,360,790 11/1982 Heise ............................ 331/36 C X
4,523,151 6/1985 Bauerschmidt ............... 331/36 C X Primary Examiner—Eugene R. LaRoche
Assistant Examiner—Robert J. Pascal
Attorney, Agent, or Firm—Gerald J. Ferguson, Jr.; James E. Bryan; Michael P. Hoffman

[57] ABSTRACT

An FM demodulator having a phase comparator, a low-pass filter and a VCO including a variable capacitance diode, an input signal being applied to the phase comparator and a demodulated output signal being taken from the low-pass filter. The FM demodulator further includes a compensating circuit consisting of a non-linear element connected between the demodulated output terminal and the VCO, whereby the secondary distortion in the output signal to be caused due to the non-linearity of the variable capacitance diode is canceled.

10 Claims, 4 Drawing Figures

FM DEMODULATOR INCLUDING PLL AND IMPROVED CIRCUITRY FOR ELIMINATING DISTORTION IN THE OUTPUT THEREOF

BACKGROUND OF THE INVENTION

1. Field of the Invention

This invention relates to an FM demodulator and, more particularly, to an FM demodulator of the kind in which a VCO (voltage-controlled oscillator) employing a varactor diode is used as a demodulator.

2. Description of the Prior Art

Conventionally, various types of circuit are used as FM demodulators. For example, an FM demodulator based on the PLL (phase locked loop) method using a varactor diode has a construction as shown in FIG. 1, in which a frequency-modulated (FM) signal is input from an input portion IN to a phase comparator 11 and an oscillation frequency signal from a VCO 12 is also input from another input portion 13 to the phase comparator 11, respectively. Then, an error signal based on the phase difference between the above FM signal and the oscillation frequency signal is output from the phase comparator 11. This error signal is input as an oscillation frequency control signal to the VCO 12, thereby controlling the oscillation frequency of the VCO to follow the frequency deviation. As is obvious from the above-mentioned construction, the signalling system constitutes a PLL and a signal on the output line of an amplifier 4 is output (OUT) as a demodulation signal.

The VCO 12 includes a varactor diode and the oscillation frequency is controlled by controlling the voltage to be applied to this varactor.

However, in the above-described conventional FM demoduator, since the change of the electrostatic capacity with respect to the change of the voltage applied to the varactor is not ideal, this causes a deviation of the output frequency of the VCO 12 (which changes due to the change of the electrostatic capacity of the varactor) with respect to the ideal output frequency, so that there is a drawback in that this deviation is output as a distortion component of the demodulation signal on the output line of the amplifier 4 and thus the sound quality suffers.

SUMMARY OF THE INVENTION

It is an object of the present invention to provide an FM demodulator which solves the above-mentioned drawback in conventional FM demodulators and in which distortion components can be eliminated.

DESCRIPTION OF THE PREFERRED EMBODIMENTS

Figure 1:
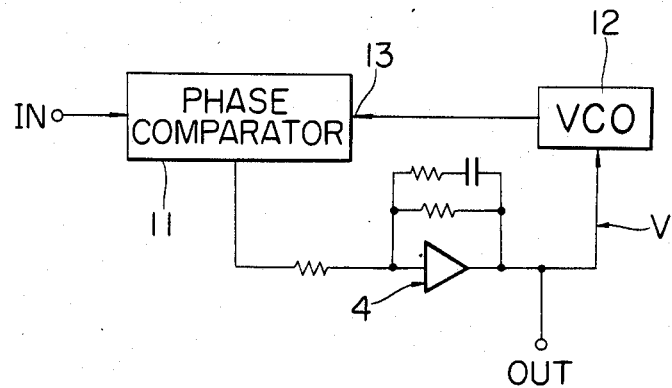
FIG. 1 is a block diagram showing a conventional FM demodulator.

An embodiment of the present invention will be described hereinbelow with reference to FIG. 2.

In the drawing, a reference numeral 1 denotes a phase comparator and 2 indicates a VCO which includes a variable capacitance (varactor) diode D, in which the fluctuation of the potential at an input terminal 3 of the varactor diode D causes the output frequency of the VCO 2 to fluctuate. An error signal is input from the phase comparator 1 through an amplifier 4 to the input terminal 3 of the varactor diode D. This construction is similar to the conventional construction. A compensating circuit 5 for controlling the voltage fluctuation at an output terminal OUT so that it is proportional to the frequency deviation at an input portion IN is connected to the input terminal 3. This compensating circuit 5 is constituted by a network consisting of a non-linear element and a resistor in this embodiment. A diode $D_1$ whose cathode side is grounded and one end of a resistor $R_1$ are connected in series. On the other hand, a diode $D_2$ whose anode side is grounded and one end of a resistor $R_2$ are connected in series. The respective other ends of the resistors $R_1$ and $R_2$ are connected through a variable resistor VR. An adjusting point of the variable resistor VR is connected to the input terminal 3, thereby allowing the voltage applied to each diode $D_1$ or $D_2$ to be varied.

Now, an analysis of the distortion component and a principle of elimination of the distortion component will be given. In the conventional demodulator case, where the characteristic of the output frequency of the VCO with respect to the input voltage to the VCO is non-linear, the demodulated output V is given by the following expression (1) where $a_n$ are constants, p is the instantaneous angular frequency, and t is time.

$$V = \sum_{n=0}^{\infty} a_n \cos^n pt \tag{1}$$

Namely, multi-degree distortions occur. However, it is known that the distortion components of the demodulated output is mainly the secondary harmonic and there are relatively few tertiary or higher degree harmonics. When considering up to the third term of expression (1), we can approximate expression (1) as follows.

$$V \approx a_0 + a_1 \cos pt + a_2 \cos^2 pt \tag{2}$$

(In a conventional circuit, the distortion component of $a_2 \cos^2 pt$ is included in the demodulated output.) In the present invention, with respect to voltages $Vd_1$ and $Vd_2$ applied to the diodes $D_1$ and $D_2$, when the adjusting point of the variable resistor VR reaches $$\begin{cases} \text{point } F, & Vd_1 \ll Vd_2 \\ \text{point } G, & Vd_1 \gg Vd_2 \end{cases} \tag{3}$$

On the other hand, the voltage to current characteristic of each diode $D_1$, $D_2$ is expressed by $$I = I_S \left( e^{\frac{qV}{kT}} - 1 \right). \tag{4}$$

Where $I_S$=the saturation current, q=charge, k=the Boltzmann constant, T=absolute temperature, V=the applied voltage, and I is the diode current.

When the magnitude of the distortion component is much smaller than the fundamental the voltages V applied to each diode $D_1$ and $D_2$ should be extremely small as expressed by the following equation (3).

$$\left|\frac{qV}{kT}\right| << 1 \tag{5}$$

Figure 2:
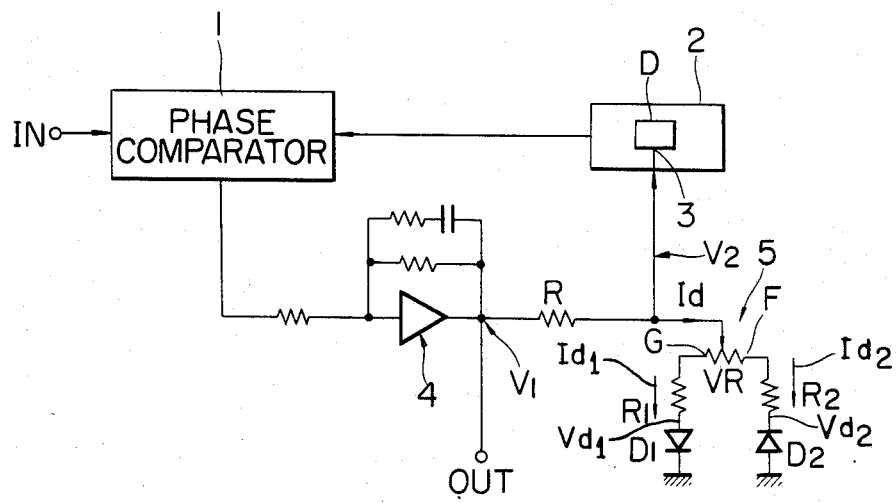
FIGS. 2 to 4 are block diagrams showing embodiments of FM demodulators according to the present invention.

Therefore, when approximating expression (4) as follows $$I \approx Is\left\{\frac{qV}{kT} + \frac{1}{2}\left(\frac{qV}{kT}\right)^2\right\} = b_1 V + b_2 V^2, \tag{6}$$

$$b_1 = \frac{I_s q}{kT} \text{ and } b_2 = \frac{I_s q}{2kT}$$

the currents Id (see FIG. 2 flowing through the diodes $D_1$ and $D_2$ will be $$Id = Id_1 + Id_2 = b_1 Vd_1 + b_2 Vd_1{}^2 + b_1 Vd_2 - b_2 Vd_2{}^2. \tag{7}$$

Due to the non-linear characteristic of the output frequency of the VCO with respect to the input voltage of the VCO, the voltage $V_2$ applied to the VCO is $$V_2 = a_0 + a_1 \cos pt + a_2 \cos^2 pt, \text{ see expression (2)}.$$

Thus, the voltage $V_1$ at the output terminal OUT is $$V_1 = V_2 + RId \tag{8}$$

$$= a_0 + a_1 \cos pt + a_2\cos^2 pt +$$

$$R\{(Vd_1 + Vd_2)b_1 + (Vd_1{}^2 - Vd_2{}^2)b_2\}$$

$$= a_0 + a_1 \cos pt + b_1 R(Vd_1 + Vd_2) +$$

$$a_2\cos^2 pt + b_2 R(Vd_1{}^2 - Vd_2{}^2)$$

Figure 3:
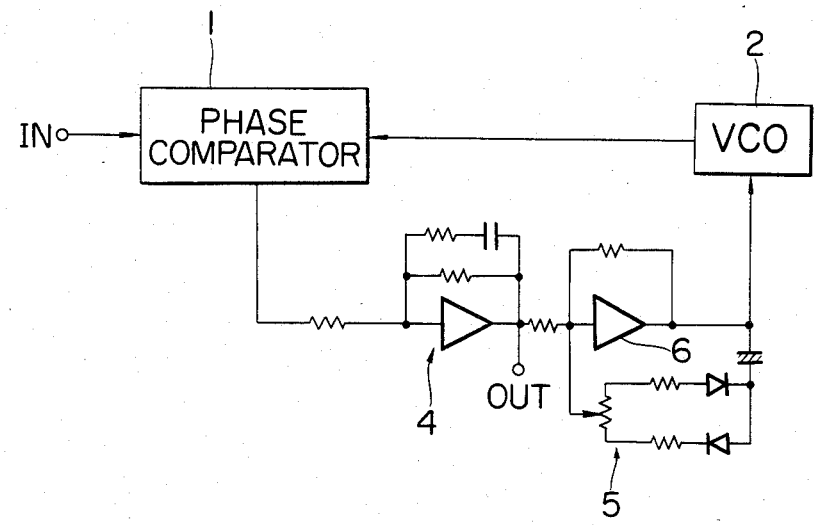
Figure 4:
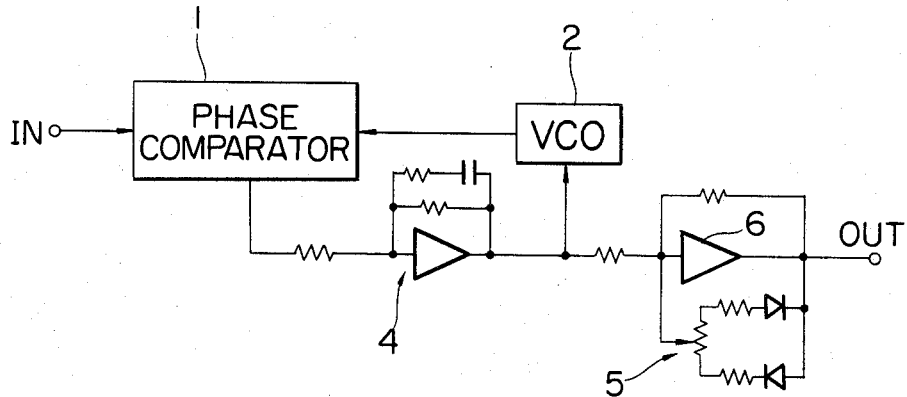

When $a_2 = 0$ (in the case where no non-linear distortion exists), if the variable resistor VR is adjusted such that $Vd_1 = Vd_2$, no distortion will occur in the demodulated output (OUT). When $a_2 > 0$ (in the case where some non-linear distortion exists), the adjustment of VR such that $Vd_1 < Vd_2$ enables the term of $a_2 \cos^2 pt$ to be canceled. Similarly, when $a_2 < 0$, if it is adjusted such that $Vd_1 > Vd_2$, the term of $a_2 \cos^2 pt$ can be canceled. FIGS. 3 and 4 show other embodiments of the present invention, in which FIG. 3 shows a block diagram wherein the compensating circuit 5 is connected to a feedback circuit of an operational amplifier 6 and FIG. 4 shows a block diagram wherein compensating circuit 5 is provided outside of the PLL. The operations of these embodiments are similar to the operation of the circuit of FIG. 2; their descriptions are omitted here.

According to the FM demodulator of the present invention, a loop is provided whereby the oscillation frequency of a VCO is controlled by the voltage applied to a varactor diode and the voltage at the input terminal of the varactor diode in the VCO tends to fluctuates in response to non-linearity of the varactor. A compensating circuit is provided to the above input terminal to control the voltage applied to the varactor diode such that the voltage fluctuation at the above output terminal OUT is proportional to the frequency deviation of the input signal applied to the demodulator. Therefore, it is possible to cancel the distortion components caused by the VCO, there thus being an excellent improvement in sound quality.

We claim:

1. An FM demodulator having a phase comparator, a low-pass filter and a non-linear VCO including a variable capacitance diode, an input signal being applied to said phase comparator and a demodulated output signal being taken from said low-pass filter, said FM demodulator further including a non-linear element responsive to said demodulated output signal for removing therefrom any second harmonic components which may be present therein due to said variable capacitance diode.

2. In an FM demodulator having a phase-lock loop including a non-linear VCO having at least one varactor as a frequency determining component, a phase comparator responsive to the signal to be demodulated and the output of the VCO, a low-pass filter responsive to the output of the phase comparator to develop the demodulated signal, the output of the low-pass filter being applied to the VCO as a control signal where an inherent second harmonic component tends to be in said demodulated signal due to the non-linearity of said varactor, the improvement comprising compensating circuit means including at least one non-linear element responsive to said demodulated signal for cancelling said inherent second harmonic component from the demodulated signal to thereby render the output of the VCO a substantially linear function of said control signal even though the varactor is a non-linear element.

3. In an FM demodulator having a phase-lock loop including a VCO having at least one varactor as a frequency determining component, a phase comparator responsive to the signal to be demodulated and the output of the VCO, a low-pass filter responsive to the output of the phase comparator to develop the demodulated signal, the output of the low-pass filter being applied to the VCO as a control signal where an inherent second harmonic component tends to be in said demodulated signal due the non-linearity of said varactor, the improvement comprising compensating circuit means including (a) at least one non-linear element responsive to said demodulated signal for cancelling said inherent second harmonic component from the demodulated signal to thereby render the output of the VCO a substantially linear function of said control signal even though the varactor is a non-linear element; (b) adding means for adding a further second harmonic component to said demodulated output signal; and, (c) adjusting means for adjusting the amplitude and polarity of the further second harmonic component until its amplitude substantially equals and its polarity is opposite to that of the inherent second harmonic component to thereby effect said cancellation of the inherent second harmonic from the demodulated signal.

4. The improvement as in claim 3 where said adding means includes a pair of oppositely poled diodes connected in parallel, said diodes being responsive to the demodulated signal.

5. The improvement as in claim 4 where said adjusting means includes a variable resistor with a tap, said diodes being connected to opposite ends of the variable resistor and the tap being responsive to the demodulated signal.

6. The improvement as in claims 4 or 5 where said oppositely poled diodes are connected in the feedback circuit of an operational amplifier.

7. The improvement as in claims 2, 3, or 4 where said compensating circuit means is connected between the output of the low-pass filter and the VCO.

8. The improvement as in claims 2, 3, or 4 where said compensating circuit means is connected between the output of the low-pass filter and a reference voltage.

9. The improvements as in claim 8 where said reference voltage is ground.

10. The improvement as in claims 2, 3, or 4 where said compensating circuit means is connected between the output of the low-pass filter and an output terminal for the demodulated signal.

* * * * *